United States Patent [19]
Katahira

[11] Patent Number: 5,410,922
[45] Date of Patent: May 2, 1995

[54] LOCATING TABLE APPARATUS

[75] Inventor: Masayuki Katahira, Gunma, Japan

[73] Assignee: NSK Ltd., Tokyo, Japan

[21] Appl. No.: 40,019

[22] Filed: Mar. 30, 1993

[30] Foreign Application Priority Data

Mar. 31, 1992 [JP] Japan .................................. 4-077675

[51] Int. Cl.6 ............................................ F16H 25/20
[52] U.S. Cl. .................................. 74/89.15; 55/385.2;
96/19; 96/87; 108/43; 277/2; 277/237 A;
277/901; 454/187
[58] Field of Search ............... 74/89.15, 424.8 R, 459;
96/66, 68, 87, 94, 19, 98; 108/143; 384/43, 130;
95/3; 55/385.2; 277/237 A, 901, 2

[56] References Cited

U.S. PATENT DOCUMENTS

| 3,541,390 | 11/1970 | Jahnke | 96/98 X |
| 3,680,281 | 8/1972 | Jahnke et al. | 96/19 |
| 3,973,927 | 8/1976 | Furchner et al. | 96/19 X |
| 4,502,002 | 2/1985 | Ando | 96/19 |
| 4,569,684 | 2/1986 | Ibbott | 96/99 X |
| 4,955,244 | 9/1990 | Katahira | 74/89.15 |

FOREIGN PATENT DOCUMENTS

| 3001595 | 7/1981 | Germany | 96/19 |
| 53-5468 | 1/1978 | Japan | 96/94 |
| 63-213737 | 9/1988 | Japan | 454/187 |

Primary Examiner—Allan D. Herrmann
Attorney, Agent, or Firm—Sughrue, Mion, Zinn, Macpeak & Seas

[57] ABSTRACT

A locating table apparatus according to the present invention is provided with a housing, a base member fixed in the housing, a table mounted so as to freely move in a longitudinal direction, driving members located on the base member for supporting and driving the table, and a plurality of electrostatic dust absorbing members arranged at predetermined positions in the housing via respective electrical insulative members, wherein the electrostatic dust absorbing members provide a parallel plate-shaped condenser. Further, the locating table apparatus may provide a dust counter for monitoring the dust density at predetermined positions outside the housing, a device for operating the electrostatic dust absorbing members when the monitored dust density exceeds a warning level, and a device for forcing the motor to stop in response to a level of a signal detected by the dust counter.

14 Claims, 6 Drawing Sheets

LOCATING TABLE APPARATUS

BACKGROUND OF THE INVENTION

The present invention relates generally to a locating table apparatus. More particularly, the present invention relates to the locating table apparatus preferably employed for the purpose of precisely locating a semiconductor producing equipment operable mainly in a clean room.

In general, a conventional locating table apparatus employed in a clean room is constructed such that air in the vicinity of a movable portion such as a ball screw, a ball nut, a linear guide bearing, a support bearing or the like is forcibly sucked by driving, e.g., a vacuum pump to remove dust generated there (fine particles such as abrasion powder, lubricant particles or the like) from the air, the sucked air is caused to pass through an air filter, and the collected dust is then exhausted to the outside so as to maintain the working environment in the duet-free state (refer to e.g., U.S. Pat. No. 4,955,244).

For example, as shown in FIG. 6 which schematically shows the structure of the conventional locating table apparatus, both ends of a screw shaft 20 are rotatably supported by supporting members 32 and 33 fixedly mounted on a base stand 31 in a clean room 30, and a motor 21 is operatively connected to the other end of the screw shaft 20. A nut 25 threadably fitted onto the screw shaft 20 is guided so as to linearly move along a linear guide rail 24b by means of a support member 23 and a linear guide bearing 24a.

A hole 22 is provided on the nut 25 so as to penetrate from the outer surface of the nut 25 to an interior thereof, and a spirally extending exhaust tube 26 is elastically connected to the nut 22 via a nipple (not shown). In detail, the dust generated from the nut 25 is sucked into the exhaust tube 26 by driving an air pump 27, so that the dust is collected in an air filter 28. Subsequently, the clean air removed the dust is caused to recirculate in the clean room 30. The exhaust tube 26 is formed so as to expand and move along a support member 26a. Reference numeral 26b designates a suction piping by way of which the exhaust tube 26 is communicated with the air pump 27.

With the conventional locating table apparatus constructed as described above, when the motor 21 is driven, the nut 25 is axially moved along the screw shaft 20 corresponding to rotational directions of the motor 21. At this time, the duet generated in the vicinity of the nut 25 is sucked into the exhaust tube 26 through the hole 22, so that the dust is collected in the air filter 28.

In addition, the dust density in the clean room 30 is normally monitored by a measuring instrument (dust counter) 34. A controlling device 35 controls the motor 21 such that the motor 21 is driven only when the monitored dust density is higher than a predetermined value. Thus, an environmental servo-system for the clean room 30 is built in the above-described manner.

With the conventional locating table apparatus constructed as described above, although a vacuum method of keeping the dust generating source clean at all times by evacuating is effective to some extent, it is known that various problems are accompanied because of the vacuum piping system as follows.

(1) The air pump, the air filter, the exhaust piping system and so forth occupy a considerably large space inside and outside the table apparatus.

(2) The exhaust piping system are trailed along with the table moving in the forward and rearward directions, so that a new dust generating source arises.

(3) The lower limit of a particle size the dust can be collected in the air filter is definitively determined depending on the mesh size of the air filter.

(4) Even if the linear guide bearing and the linear guiding portion each equipped with a closed type contact seal (e.g., a rubber seal) are cleaned by means of sucking the interior thereof, the cleaning effect obtained is small. In addition, there is a problem that the contact seal itself becomes another dust generating source.

SUMMARY OF THE INVENTION

With the above problem and difficulty accompanying the conventional locating table apparatus, an object of the present invention is to provide a locating table apparatus including members which assures that a clean room can be kept clean without employing a piping system such as a conventional vacuum method or the like.

To accomplish the above object, the present invention provides the locating table apparatus including a table mounted movably in the axial direction by a shaft in a housing thereof and supported by linear movement guiding members disposed on the side of the base stand, wherein the locating table apparatus is characterized in that a plurality of electrostatic dust absorbing members each serving as a parallel plate-shaped condenser are arranged at predetermined positions in the housing while an electrical insulative member is interposed between each electrostatic dust absorbing member and the opponent component.

According to the present invention, when a rod-shaped movable member such as a ball screw, a support bearing, a motor shaft or the like is surrounded by a cup-shaped dustproof cover having a plurality of doughnut-shaped electrostatic dust absorbing plates arranged at regular intervals, a dust collection can be achieved at a high efficiency with compact structure.

Further, when a certain voltage is applied to a plurality of annular parallel plate-shaped condensers such that surfaces of adjacent condensers located opposite to each other are electrically charged with a same polarity, a dust collecting effect can increasingly be improved.

Moreover, when each parallel plate-shaped condenser is operatively interlocked with a dust counter, an environment-servo system can be built such that the locating table apparatus is operated only when the monitored dust density is lower than a predetermined value.

With the locating table apparatus thus constructed, since the locating table apparatus is operated by applying a predetermined voltage to each parallel plate-shaped condenser, fine dust particles such as abrasion powder or a lubricant generated at each movable portion such as a ball screw unit or a support bearing are electrically charged in the vicinity of electrode plates of the electrostatic dust absorbing plates arranged in the dustproof cover secured to the ball screw, so that the dust particles are electrostatically absorbed an the electrostatic dust absorbing plates. Similarly, the duet particles generated from a linear guiding unit or a motor shaft are collected and absorbed on the electrostatic dust absorbing plates arranged at predetermined positions in the housing.

With the locating table apparatus according to the present invention, since the parallel plate-shaped condensers constituting the electrostatic dust absorbing plates are simply constructed without having accessories but an electricity feeding cord, a space required for the housing of the locating table apparatus can be determined without any restriction. Further, since a piping system according to the present invention is not caused to expand and contract such as the conventional vacuum method or the like, the locating table apparatus is constructed with dust removing components having very simple structure.

BRIEF DESCRIPTION OF THE DRAWINGS

In the accompanying drawings.

DETAILED DESCRIPTION OF THE PREFERRED EMBODIMENTS

Figure 1:
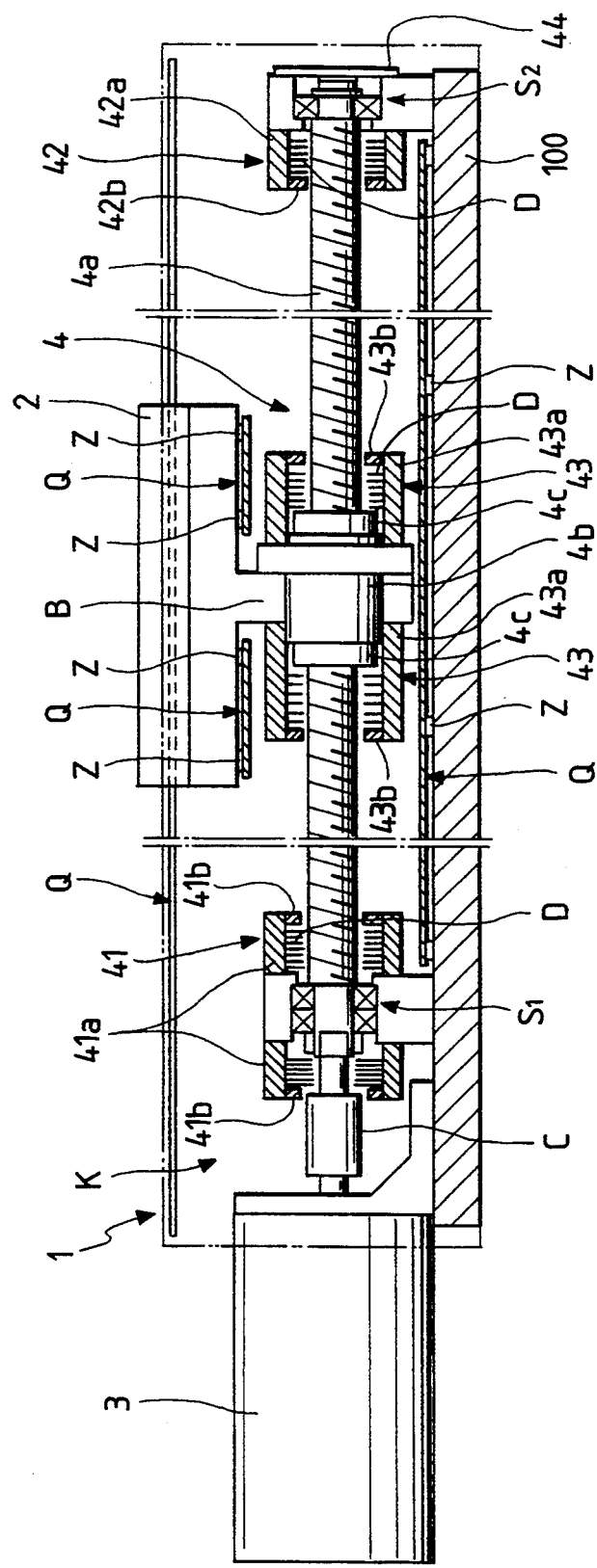
FIG. 1 is a vertical sectional view of a locating table apparatus constructed according to an embodiment of the present invention, particularly showing the whole interior structure of the locating table apparatus.

The present invention will now be described in detail hereinafter with reference to FIG. 1 to FIG. 5 which illustrate a preferred embodiment thereof.

FIGS. 1 to 4, reference numeral 1 designates a housing for a locating table apparatus constructed according to the embodiment of the present invention. The housing provides a driving system K on a base stand 100 and a table located above the driving system K. The table 2 provides two projections 2a at both ends of an upper surface thereof, and a lower surface of the table 2 is supported by linear guide bearings 5b via spacers 2b disposed at both ends thereof, so that the table 2 can freely move in the longitudinal direction. In addition, the central part of the lower surface of the table 2 is threadably engaged with a ball screw nut 4b via a bracket B.

The driving system K is composed of a motor 3 and a ball screw 4 linked to the motor 3 so as to enable the table 2 to move in the longitudinal direction along the ball screw shaft 4a. The screw shaft 48 of the ball screw 4 is operatively linked to the motor 3 via a coupling C. Since the table 2 is fixedly mounted on the ball screw nut 4b fitted onto the screw shaft 4a (via the bracket B), the table 2 can move in the forward and rearward directions together with the ball screw nut 4b corresponding to the rotational directions of the motor 3. Reference numeral 4c designates an end cap.

Figure 4A:
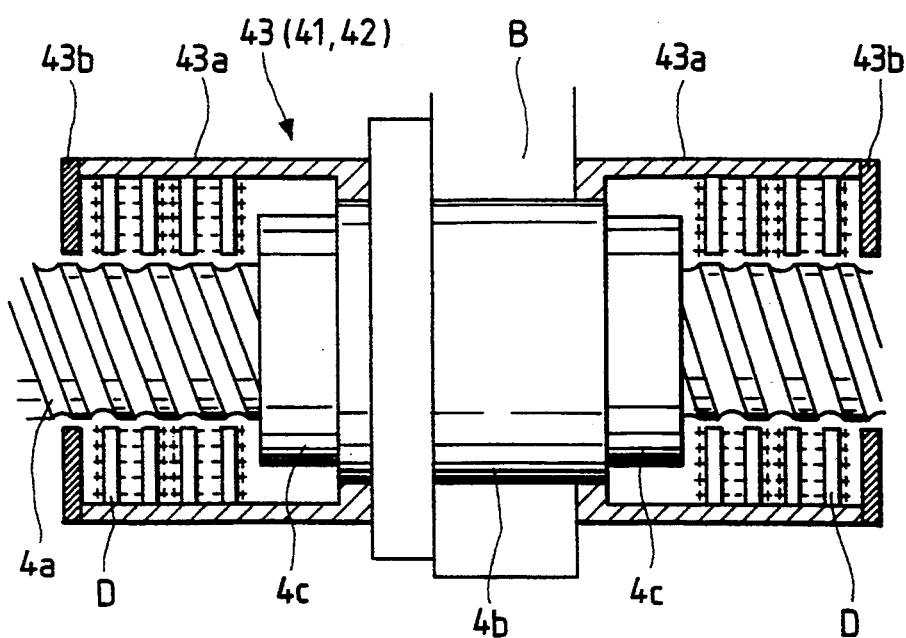
FIG. 4(a) is an enlarged sectional view showing the interior structure of a cup-shaped dustproof cover in the locating table apparatus.

The ball screw nut 4b is surrounded with a cup-shaped dustproof cover 43 having electrostatic dust absorbing members incorporated therein so as to achieve a dustproof effect by substantially sealing the vicinity of the bearing portion of the screw shaft 4a. Particularly, as shown in FIG. 4(a), the cup-shaped dustproof cover 43 is constructed such that end opening portions of a cylindrical air filter 43a are sealed with annular plate-shaped seals 43b at both ends thereof, and a plurality of doughnut-shaped electrostatic dust absorbing plates D (each serving as a parallel plate-shaped condenser) are arranged at regular intervals in the longitudinal direction along the screw shaft 4a. With this construction, the cylindrical air filter 43a and annular plate-shaped seals 43b prevent the dust generated at the contact portion between the ball screw nut 4b and the screw shaft 4a from scattering to the outside. Further, the electrostatic dust absorbing plates D serve to collect and absorb the dust. Thus, the dust generated in the vicinity of the ball screw nut 4b is prevented from leaking out the dustproof cover 43.

Figure 4B:
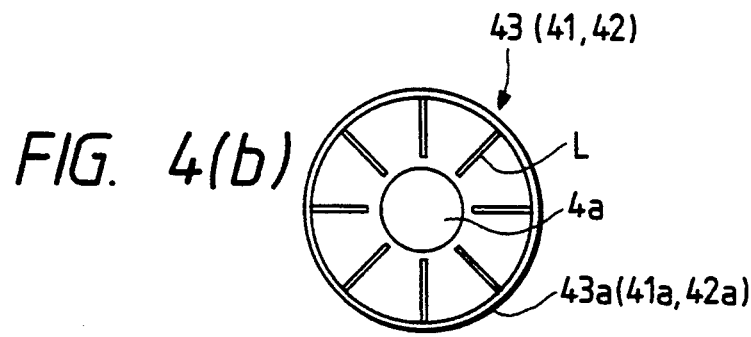
FIG. 4(b) is a cross-sectional view showing another cup-shaped dustproof cover wherein a plurality of rectangular electrostatic dust absorbing plates are radially arranged at regular intervals in the circumferential direction.

The electrostatic dust absorbing member can be constructed such that a plurality of rectangular electrostatic dust absorbing plates L extending in the longitudinal direction along the screw shaft 4a are radially arranged at regular intervals serving the screw shaft 4a as the center, as shown in FIG. 4(b).

Further, it is desirable from the viewpoint of resistance against a high voltage and improvement of a dustproof efficiency that the respective electrostatic dust absorbing plates D are arranged such that a certain voltage is applied to each electrostatic dust absorbing plate D while an electric charge on each of electrodes located adjacent to each other exhibits a same polarity.

Figure 2:
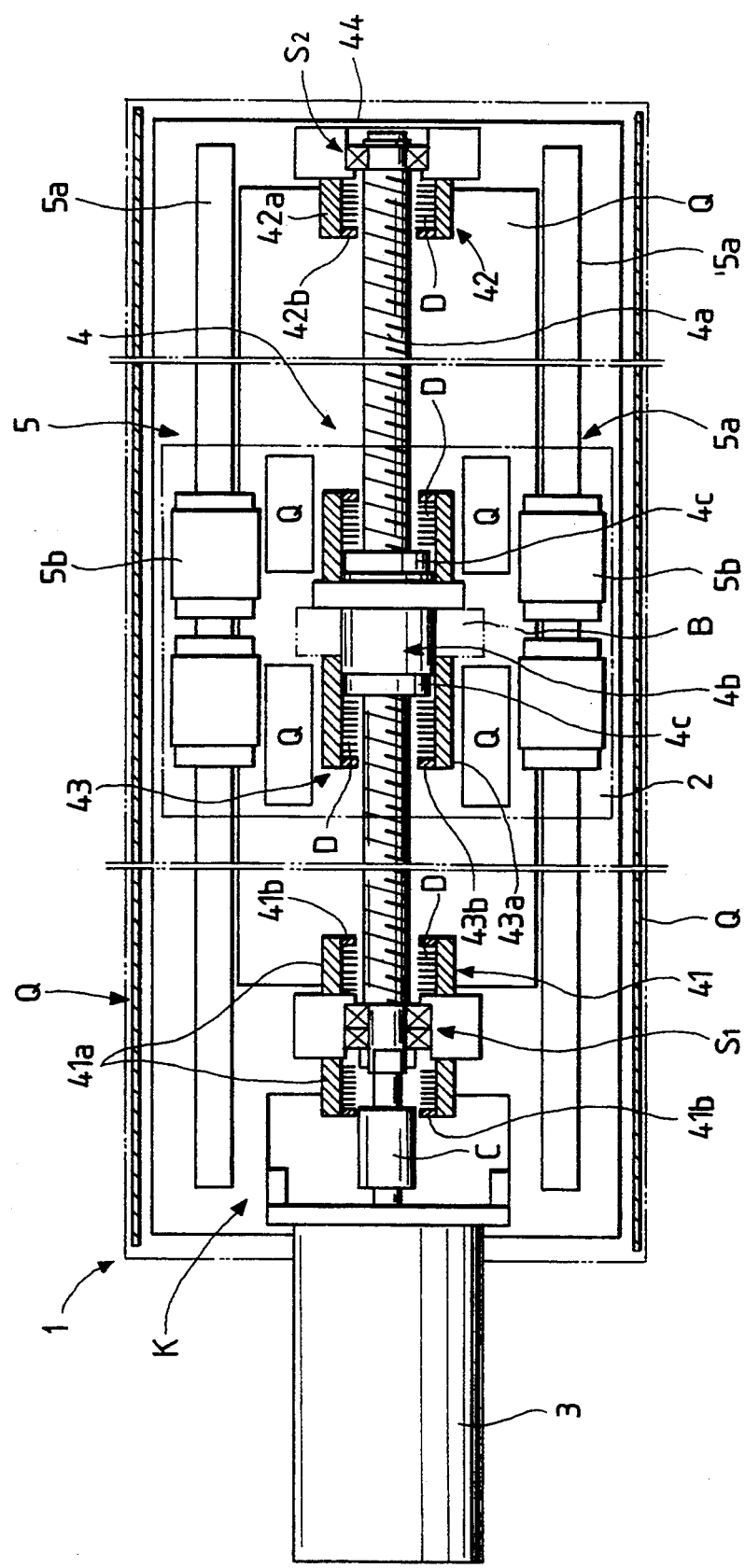
FIG. 2 is an exploded plan view showing the whole interior structure of the locating table apparatus.
Figure 3:
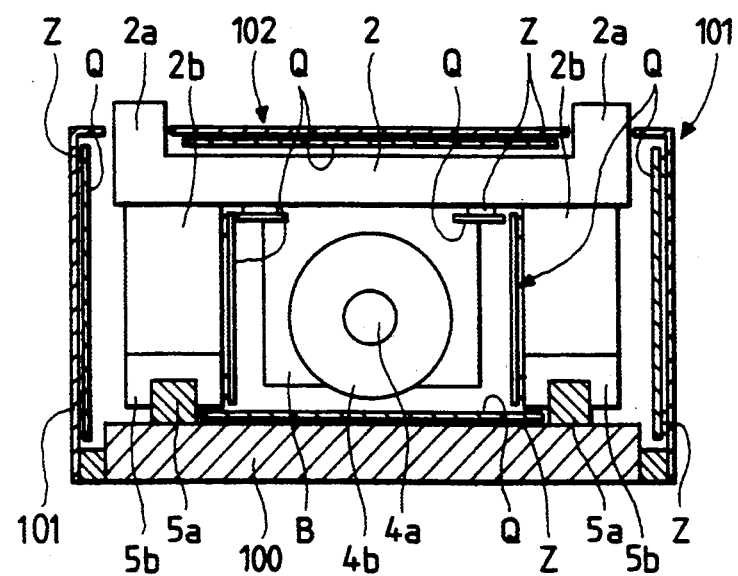
FIG. 3 is a cross-sectional view showing the whole interior structure of the locating table apparatus.

As shown in FIGS. 1 to 2, reference characters $S_1$ and $S_2$ designate support bearings for the screw shaft 4a, respectively. Specifically, the support bearing $S_1$ is disposed at the rear end of the screw shaft 4a (located in the vicinity of the coupling C linked to the motor 3). On the other hand, the support shaft 82 is disposed at the forward end of the screw shaft 4a. The support bearings $S_1$ and $S_2$ are surrounded with cup-shaped dustproof covers 41 and 42 which provide a plurality of doughnut-shaped electrostatic dust absorbing plates D arranged at the regular intervals in the longitudinal direction along the screw shaft 4a inside cylindrical members composed of cylindrical air filters 41a and 42a and annular plate-shaped seals 41b and 42b. Each of the cup-shaped dustproof covers 41 and 42 serves to substantially seal the vicinity of the bearing portion of the screw shaft 4a, so that the dust particles generated in the support bearings are prevented from scattering. Moreover, the electrostatic dust absorbing plates D provided in the covers can collectively absorb the dust particles.

Reference numeral 44 designates a seal plate which serves to cover the foremost end of the screw shaft 4a (located opposite to the motor 3). As shown in FIG. 2, reference numeral 5 designates a linear guiding unit. Each linear guiding unit 5 provides a linear guide rail 5a and a linear guide bearing 5b fitted onto the linear guide rail 5a. The linear guiding units 5 are arranged on both sides of the base stand 100 while extending in parallel with the screw shaft 4a of the ball screw 4.

Reference character Q designates electrostatic dust absorbing plates. Each of the electrostatic dust absorbing plate Q provides a parallel plate-shaped condenser which is arranged at a predetermined position inside the housing i via an electrical insulative material Z. In detail, the electrostatic dust absorbing plates Q are fixedly arranged on the upper surface of the base stand 100, an inner wall surface of a side soundproof cover 101 of the housing 1, a lower surface of an upper soundproof cover 102 placed on the table 2, and surfaces of both the spacers 2b and linear guide bearings 5b on side of the ball screw 4 while an electrical insulative material Z is interposed between each electrostatic dust absorbing plate Q and the opposite component. Further, the four electrostatic dust absorbing plates Q are also fixedly arranged on the lower surface of the table 2 via electrical insulative plates Z, so that dust generated deep the ball screw nut 4b, which is the largest dust generating source, is prevented from scattering by surrounding the moving range thereof with the electrostatic dust absorbing plates Q.

According to the embodiment as described above, when the motor 3 is driven, the screw shaft 4a is rotated by transmitting a rotational power generated by the motor 3 thereto via the coupling C. At this time, the dust generated by the support bearings $S_1$ and $S_2$ supporting both the ends of the screw shaft 4a is absorbed on the electrostatic dust absorbing plates D and collected in the air filters 41a and 42a in the cup-shaped dustproof covers 41 and 42.

The ball screw nut 4b fitted onto the screw shaft 4a at the intermediate position is moved in the forward and rearward directions corresponding to the rotational direction of the screw shaft 4a. At this time the dust generated is collected by and absorbed in the cup-shaped dustproof cover 43 mounted on the ball screw nut 4b. The dust particles generated from the linear guiding units 5 and leaked from the support bearings $S_1$ and $S_2$ are electrically charged when the dust particles pass in the vicinity of the electrostatic dust absorbing plates Q arranged at the predetermined positions in the housing 1, so that the dust particles are electrostatically absorbed on the respective electrostatic dust absorbing plates Q. Thus, almost Of all the dust particles generated during the movement of the table 2 together with the ball screw nut 4b is captured by each electrostatic dust absorbing plates Q.

The electrostatic dust absorbing plates Q as mentioned above can be employed in case that the dustproof effect is achieved by arranging the plates at predetermined positions outside the housing 1 or in case that a clean room is increasingly kept clean by arranging the plates at the predetermined positions in the clean room. Further, the electrostatic dust absorbing plates Q may be incorporated to serve as the dustproof members in various kinds of equipments operating in the clean room.

Figure 5:
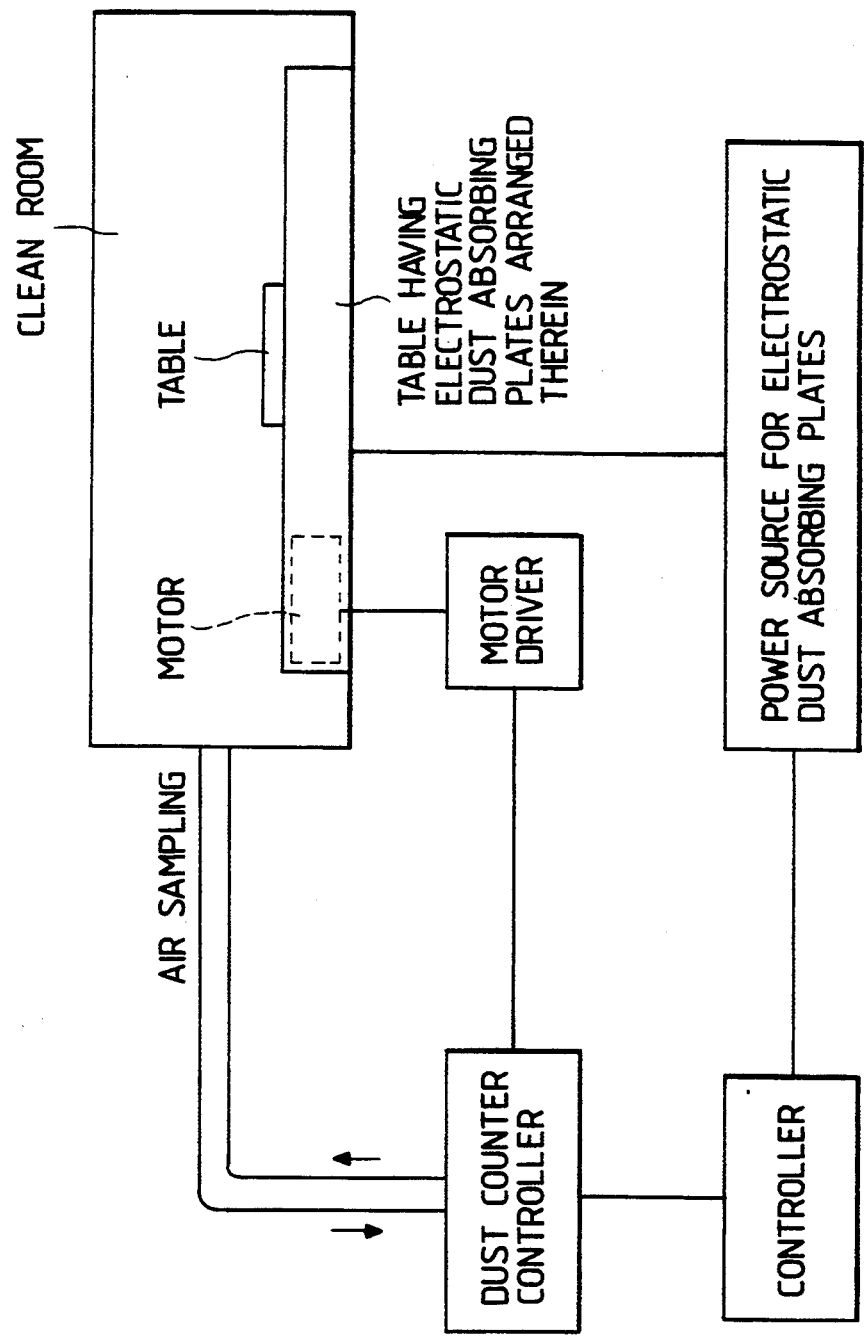
FIG. 5 is a block diagram schematically illustrating an embodiment employing an environmental-servo system according to the present invention.
Figure 6:
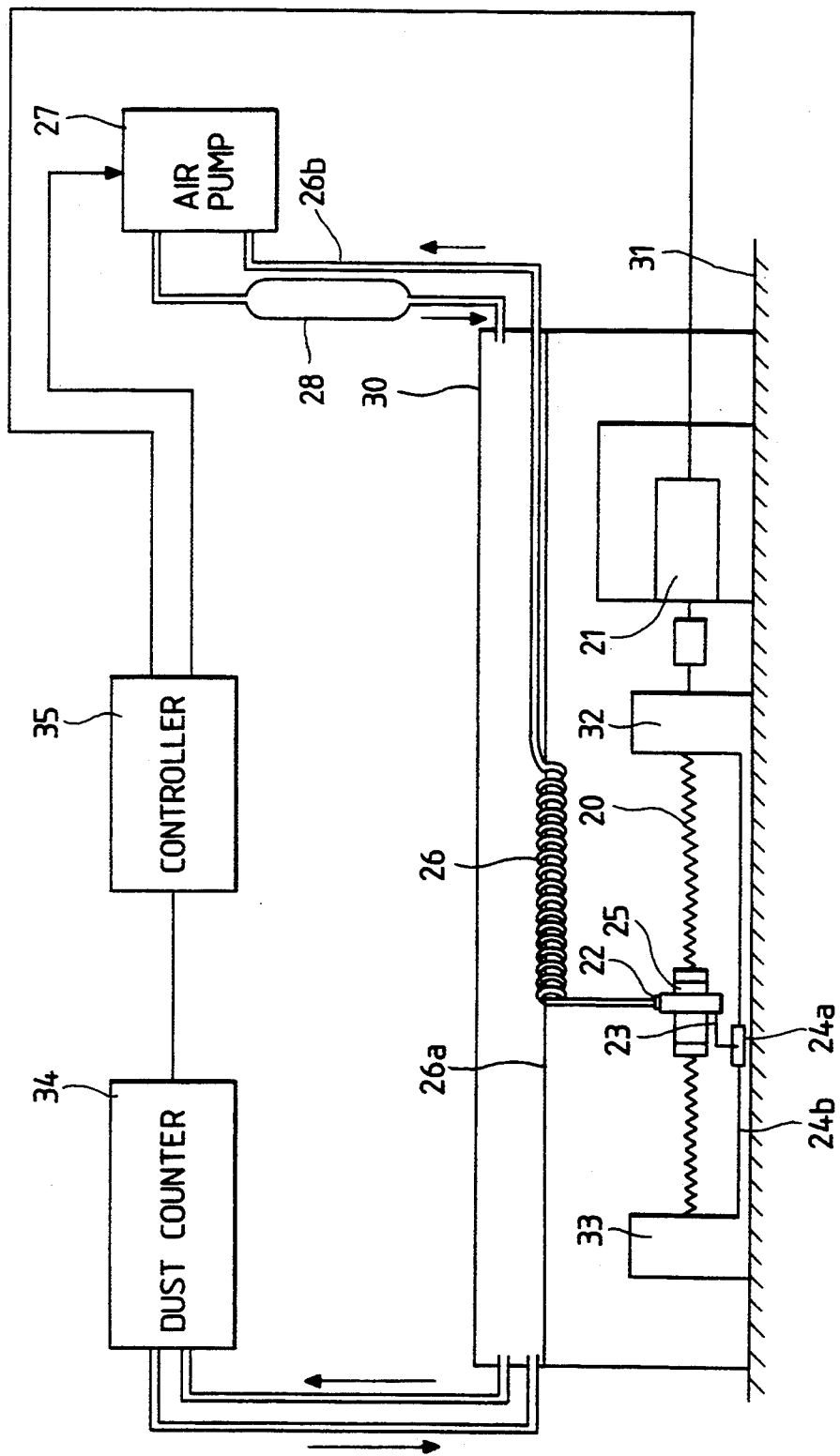
FIG. 6 is an view illustrating a principle structure of a conventional locating table apparatus employing a vacuum method.

Moreover, an environmental servo-system can be built with the locating table apparatuses of the present invention. With the environmental servo-system, each dust density at the predetermined positions in the clean room is normally monitored by a dust counter, so that the electrostatic dust absorbing plates can be immediately operated when the monitored duet density exceeds a warning level. Still further, the rotation of the motor 3 can be forced to stop in response to a level of a signal selected by the dust counter (are shown in FIG. 5).

As is apparent from the above description, according to he present invention, since a plurality of the electrostatic dust absorbing plates are arranged at the predetermined positions in the housing of the locating table apparatus, a high degree of cleanness can be maintained with desirably simple structure by the function of electrostatic absorption. Particularly, with respect to the ball screw nut of the ball screw and the support bearings each generating the dust with a high density, since the dust generated is electrostatically collected by and absorbed in the cup-shaped dustproof cover while preventing the dust from scattering away, the dustproof function can be achieved at a high efficiency. Further, since the dust particles each having various particle size can absorbingly be removed from the locating table apparatus, the fine dust particles which can not be removed by employing a conventional air filter method can desirably be removed from the locating table apparatus according to the present invention. In case that the locating table apparatus operates in the vacuum, the dust removing effect can also be achieved within the locating table apparatus.

Since each electrostatic dust absorbing plate occupies a small space without requiring a large-sized accessory such as a exhaust tube or the lake, the locating table apparatus can be designed with a high degree of freedom. Therefore, the locating table apparatus can practically be designed with compact structure. Further, the power source for the motor rotating the ball screw can be used also as a power source for activating each electrostatic dust absorbing plate, and the locating table apparatus is practically operated for a long time.

As a result, the present invention has an advantageous effect; that it provides the locating table apparatus which assures that excellent reliability con be kept for a long time while a high degree of cleanness in the clean room maintained in the optimum state suitable for precise locating.

Moreover, when an environmental-servo system in operative association with the dust counter is built providing the electrostatic dust absorbing plates according to the present invention, the locating table apparatus can be operated at all times only when the detected dust density is lower than a predetermined value.

What is claimed is:

1. A locating table apparatus employed in a clean room, comprising:
    a housing for housing the locating table apparatus in the clean room;
    a based member fixed in said housing;
    a table mounted in said housing so as to freely move in a longitudinal direction;
    driving means disposed in said housing and located on said base member for supporting and driving said table; and
    a plurality of electrostatic dust absorbing members arranged at respective predetermined positions in said housing via respective electrical insulative members,
    wherein each of said electrostatic dust absorbing members comprises a parallel plate-shaped condenser.

2. The locating table apparatus of claim 1, wherein said driving means comprises a motor, a bracket member, a ball screw member linked to said motor and having a screw shaft, and a ball screw nut movably fitted to said screw shaft of said ball screw member in a direction along said screw shaft, and a lower surface of said table is threadably engaged with said ball screw nut via said bracket member at a central part thereof.

3. The locating table apparatus of claim 1, wherein said driving means comprises a spacer member and a linear guiding unit including a linear guide rail and a linear guide bearing fitted onto said linear guide rail, and a lower surface of said table is supported by said linear guide bearings via said spacer members at an end thereof.

4. The locating table apparatus of claim 1, wherein a voltage is applied to each of said parallel plate-shaped condensers of said electrostatic dust absorbing members to cause an electric charge on each of said electrostatic dust absorbing members located adjacent to each other to exhibit the same polarity.

5. The locating table apparatus of claim 2, further including a cup-shaped dustproof cover comprising a cylindrical air filter, an annular plate-shaped seal member sealing an end opening portion of said cylindrical air filters, and a plurality of doughnut-shaped electrostatic dust absorbing plates serving as said parallel plate-shaped condenser in said electrostatic dust absorbing members, wherein said doughnut-shaped electrostatic dust absorbing plate is arranged in the longitudinal direction along said screw shaft.

6. The locating table apparatus of claim 5, wherein said ball screw nut is surrounded with said cup-shaped dustproof cover.

7. The locating table apparatus of claim 5, wherein said driving means comprises a support bearing disposed at both ends of said screw shaft, wherein said support bearing is surrounded with said cup-shaped dustproof cover.

8. The locating table apparatus of claim 2, further including a cup-shaped dustproof cover comprising a cylindrical air filter, an annular plate-shaped seal member sealing an end opening portion of said cylindrical air filter, and a plurality of rectangular electrostatic dust absorbing plates serving as said parallel plate-shaped condenser in said electrostatic dust absorbing members, wherein each of said rectangular electrostatic dust absorbing plates extends in the longitudinal direction along said screw shaft, and is radially arranged while serving said screw shaft as a center.

9. The locating table apparatus of claim I, further comprising a dust counter for monitoring each dust density at predetermined positions outside said housing, and means for operating said electrostatic dust absorbing member when said monitored dust density exceeds a warning level.

10. The locating table apparatus of claim 9, further comprising means for forcing said motor to stop in response to a level of a signal detected by said dust counter.

11. The locating table apparatus of claim 1, wherein one of said electrostatic dust absorbing member is fixedly arranged on an upper surface of said base member.

12. The locating table apparatus of claim 1, wherein one of said electrostatic dust absorbing member is fixedly arranged on an inner surface of said housing.

13. The locating table apparatus of claim 1, wherein one of said electrostatic dust absorbing member is fixedly arranged on a lower surface of said table.

14. The locating table apparatus of claim 3, wherein one of said electrostatic dust absorbing members is fixedly arranged on surfaces of said spacer member and linear guide bearing.

* * * * *